(12) United States Patent
Iwatake et al.

(10) Patent No.: US 8,288,828 B2
(45) Date of Patent: Oct. 16, 2012

(54) VIA CONTACT STRUCTURE HAVING DUAL SILICIDE LAYERS

(75) Inventors: Michael M. Iwatake, Wappingers Falls, NY (US); Kevin E. Mello, Fishkill, NY (US); Matthew W. Oonk, Poughkeepsie, NY (US); Amanda L. Piper, Poughkeepsie, NY (US); Yun Y. Wang, Poughquag, NY (US); Keith K. Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 2197 days.

(21) Appl. No.: 10/711,298

(22) Filed: Sep. 9, 2004

(65) Prior Publication Data
US 2006/0051959 A1    Mar. 9, 2006

(51) Int. Cl.
*H01L 23/52* (2006.01)

(52) U.S. Cl. ........ 257/384; 257/389; 257/751; 257/757; 257/E29.268

(58) Field of Classification Search .......... 257/750–754, 257/763–764, 768–770, 384, 389, 757, E29.268
See application file for complete search history.

(56) References Cited

U.S. PATENT DOCUMENTS

| | | | | | |
|---|---|---|---|---|---|
| 5,094,981 | A | * | 3/1992 | Chung et al. | 438/621 |
| 5,565,708 | A | * | 10/1996 | Ohsaki et al. | 257/764 |
| 5,571,753 | A | * | 11/1996 | Saruwatari | 438/527 |
| 5,834,846 | A | | 11/1998 | Shinriki et al. | |
| 6,277,729 | B1 | * | 8/2001 | Wu et al. | 438/627 |
| 6,613,670 | B2 | * | 9/2003 | Rha et al. | 438/657 |
| 6,677,230 | B2 | | 1/2004 | Yokoyama et al. | |
| 2002/0019127 | A1 | | 2/2002 | Givens | |

FOREIGN PATENT DOCUMENTS

JP         08-107087    *   4/1996

* cited by examiner

*Primary Examiner* — Anh Mai
(74) *Attorney, Agent, or Firm* — Yuanmin Cai

(57) ABSTRACT

A via contact is provided to a diffusion region at a top surface of a substrate which includes a single-crystal semiconductor region. The via contact includes a first layer which consists essentially of a silicide of a first metal in contact with the diffusion region at the top surface. A dielectric region overlies the first layer, the dielectric region having an outer surface and an opening extending from the outer surface to the top surface of the substrate. A second layer lines the opening and contacts the top surface of the substrate in the opening, the second layer including a second metal which lines a sidewall of the opening and a silicide of the second metal which is self-aligned to the top surface of the substrate in the opening. A diffusion barrier layer overlies the second layer within the opening. A third layer including a third metal overlies the diffusion barrier layer and fills the opening.

10 Claims, 3 Drawing Sheets

VIA CONTACT STRUCTURE HAVING DUAL SILICIDE LAYERS

BACKGROUND OF INVENTION

The present invention relates to integrated circuits and their fabrication. More specifically, the invention relates to the structure and fabrication of a via contact to a diffusion region at a top surface of a single-crystal semiconductor region of a substrate.

A particular challenge encountered in the fabrication of integrated circuits is the formation of metallic via contacts to diffusion regions (referred to alternatively as "diffusions") of semiconductor devices. Such diffusion regions are formed in single-crystal semiconductor regions of a substrate, such that an ohmic contact is made between the metallic material in the via and the semiconductor material of the diffusion region. The challenge is particularly difficult to provide a robust structure and method of forming metallic via contacts having acceptably low contact resistance between the metal and the diffusion region, over all chip locations of an entire wafer.

Thus, processes and structures known heretofore have resulted in acceptable contact resistance, but only when a sufficiently thick layer of a metal silicide, e.g., greater than 20-25 nm of cobalt silicide ($CoSi_2$) or nickel monosilicide (NiSi), for example, is provided at a top surface of the diffusion region. In one such exemplary process, a metal silicide layer is formed in contact with the diffusion region of the substrate, after which an interlevel dielectric (ILD) is formed, typically consisting essentially of a highly flowable, planarizing dielectric such as borophosphosilicate glass (BPSG), undoped silicate glass (USG) or silicon dioxide deposited from a tetraethylorthosilicate (TEOS) precursor.

Thereafter, the ILD is patterned to form an opening over the metal suicide layer. A sputter clean process is then performed to clean the surface of the pre-existing metal silicide layer to make it ready for the deposition of metallic layers which enhance the conductive contact and to prepare the via to be filled with tungsten by a chemical vapor deposition (CVD) technique. However, the sputter clean process consumes some of the pre-existing metal silicide layer at the top surface of the single-crystal semiconductor region. In an example, the sputter clean process removes about 8 nm of the metal silicide. Thereafter, a thin layer of a metal such as titanium (Ti) is sputter deposited inside the via opening. For example, a layer of titanium having a thickness of 20 angstroms (Å) or less is deposited at the bottom of the opening, the deposited titanium being, illustratively, about 100 Å thick where it overlies the ILD in the field. The Ti layer promotes adhesion to the bottom and sidewalls of the opening. The Ti layer is also used to getter oxygen from a native oxide that forms on the surface of the pre-existing metal silicide layer. The Ti layer used in the conventional process is deposited to a thickness of 20 Å or less because such thickness is sufficient to promote desired adhesion properties and to perform oxygen gettering from the underlying metal silicide layer.

Thereafter, a diffusion barrier layer such as titanium nitride (TiN) is CVD deposited onto the underlying Ti layer, as a barrier to the diffusion and electromigration of material to and from the underlying Ti and silicide layers and materials present during subsequent depositions. Thereafter, a metal such as W (tungsten) is deposited, such as by CVD from a tungsten hexaflouride ($WF_6$) precursor, to fill the via after forming the Ti and TiN layers.

In the conventional process, a Ti layer having a thickness greater than 20 Å is undesirable because the sputter deposition of titanium takes up significant time, impacting the throughput and cost of each wafer. In addition, a thicker Ti layer is undesirable because the sputtering process tends to deposit more Ti at the entrance (top) surface of a via, while depositing comparatively less Ti at the bottom of the via. Accordingly, a byproduct of the Ti sputter deposition is a more constricted opening, sometimes having a re-entrant profile, that is more difficult to fill in subsequent depositions to form the TiN diffusion barrier layer and the W metal fill. If the Ti layer is not kept to the minimum thickness, the W fill metal deposition must be more tightly controlled to prevent voids and pinch-off of the via opening from occurring during deposition. Still another reason limiting the thickness of the Ti layer is a goal of the conventional process to intentionally limit the amount of Ti present in the via. The conventional process intentionally limits the amount of Ti in the via as a way of limiting damage, in case the TiN diffusion barrier layer fails in some areas of the wafer during tungsten CVD. If the TiN layer fails as a barrier, this allows the Ti to interact with the $WF_6$ precursor gas. However, $WF_6$ produces volatile compounds when it comes into contact with portions of the Ti layer. Such volatile compounds destructively impact the prior deposited layers, the W layer during deposition and subsequently deposited layers, causing severe degradation of the via structure and degrading its performance. Thus, in the conventional process, the Ti layer is kept intentionally thin for a variety of reasons, all of which are intended to improve the quality of the contact structure.

However, the above-described process only produces acceptable results when the pre-existing silicide layer underlying the ILD, i.e., the $CoSi_2$ or NiSi layer, is relatively thick, i.e., having a thickness in excess of 20 nm to 25 nm. That thickness is needed in order for the silicide layer under the ILD to remain to a sufficient thickness at locations all over the wafer after the openings in the ILD are subjected to the above-described sputter clean process. If a smaller thickness of the silicide were used, e.g., having a nominal thickness of 10 to 12 nm, the sputter clean process could result in removing the silicide layer entirely in some locations of the wafer. In such case, poor contact to the diffusion region of the semiconductor material would result, having poor contact resistance. This is a problem that needs to be addressed.

SUMMARY OF INVENTION

According to an aspect of the invention, a via contact in a via contact structure is provided to a diffusion region at a top surface of a substrate which includes a single-crystal semiconductor region. The via contact structure includes a first layer which consists essentially of a silicide of a first metal in contact with the diffusion region at the top surface. A dielectric region overlies the first layer, the dielectric region having an outer surface and an opening extending from the outer surface to the top surface of the substrate. A second layer lines the opening and contacts the top surface of the substrate in the opening, the second layer including a second metal which lines a sidewall of the opening and a silicide of the second metal which is self-aligned to the top surface of the substrate in the opening. A diffusion barrier layer overlies the second layer within the opening. A third layer including a third metal overlies the diffusion barrier layer and tills the opening.

DETAILED DESCRIPTION

It is common for transistors which have silicided diffusion regions to be contacted through openings formed in dielectric regions which overlie the diffusion regions, such as described in the foregoing. However, the demands of current and future generation transistors are not adequately served by traditionally thick suicides which underlie the ILD at the top surface of the diffusion region.

For a variety of reasons, it would be desirable to make the silicide thinner that underlies the ILD at the top surface of the diffusion region. For one, a thinner silicide helps to reduce leakage current of devices that are formed in bulk semiconductor substrates. A thinner silicide also promotes a better contact to the diffusion regions of devices that are formed in a thin semiconductor-on-insulator layer or a silicon-on-insulator layer, both referred to hereinafter as an "SOI" layer. A third reason why a thinner suicide underlying the ILD would be advantageous is to help better control the position of the edge of the silicide relative to the channel region of a transistor, when the transistor has a small channel width. This consideration is especially important when spacers separating the gate of the transistor from the source and drain diffusions thereof are smaller than desirable. In such case, a thinner silicide would help to produce better small channel width transistors, even when the spacer thickness is smaller than that considered acceptable for transistors having a traditional thicker silicide.

According to the embodiments of the invention, a process is provided herein which allows a contact having acceptable contact resistance to be made to the surface of a silicided diffusion region, even when a thinner silicide is provided on the surface of the diffusion region underlying an interlevel dielectric (ILD). According to the embodiments of the invention, a via contact is provided in which a metal-containing layer is formed in an opening in a dielectric layer above the silicided diffusion region, that layer contacting the top surface of the diffusion region in the opening. Such layer includes a metal lining the sidewall of the opening, and a silicide of that metal self-aligned to the top surface of the diffusion region in the opening. A diffusion barrier layer overlies that metal-containing layer in the opening, and a further layer of metal fills the opening overlying the diffusion barrier layer.

Figure 1:
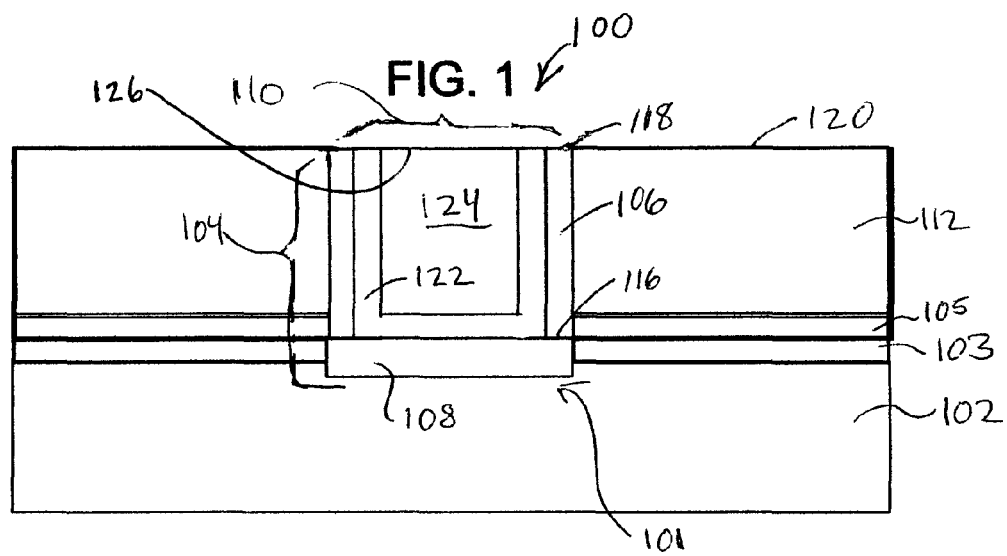
FIG. 1 is a cross-sectional view illustrating a completed via contact structure according to an embodiment of the invention.

A cross-sectional view of a completed via contact 100 according to the invention is illustrated in FIG. 1. As shown therein, the via contact extends to a top surface 101 of a diffusion region 102 of a single-crystal semiconductor region of a substrate. Illustratively, the substrate is a bulk semiconductor substrate or a semiconductor-on-insulator (SOI) substrate such as a silicon-on-insulator substrate. In preferred embodiments of the invention, the single-crystal semiconductor region consists essentially of silicon. However, other semiconductor materials can be utilized such as alloys of silicon, e.g., silicon germanium and silicon carbide. Alternatively, III-V compound semiconductors and/or II-VI compound semiconductors are usable in other embodiments of the invention.

The via contact 100 is disposed in an opening 110 in a dielectric region 112, preferably an interlevel dielectric (ILD), overlying a top surface 101 of the diffusion region 102 of the substrate. The opening has width of between about 50 nm and 400 nm, more preferably between about 100 nm to 200 nm, and most preferably having a width between about 100 nm and 150 nm. The opening has height extending from the outer surface 120 of the ILD 112 to the diffusion region 102 of between about 150 nm and about 600 nm, more preferably between about 200 nm and 500 nm, and most preferably between about 200 nm and 300 nm. The opening 110 and via contact 100 therein are disposed in the ILD 112 overlying a first layer 103 including a silicide of a first metal, the silicide being disposed in contact with the top surface 101 of the diffusion region 102. The first layer 103 preferably has a thickness of between about 8 nm and 15 nm, and more preferably between about 10 nm and 13 nm. Such thickness is much smaller than the thickness of greater than 20 to 25 nm of $CoSi_2$ or NiSi that is used in the above-described prior art process.

A layer 105 of an etch-distinguishable material is further disposed between the first layer 103 and the ILD 112. That layer 105 functions as an etch stop layer when the opening 110 is etched in the ILD 112, to stop the etching process from proceeding to etch the diffusion region 102 after the etched opening penetrates the ILD 112. A suitable material for the etch stop layer 105 is silicon nitride, when the ILD 112 includes an oxide such as the various forms of silicon oxides, e.g., BPSG, USG, or a TEOS oxide, that are typically used for that purpose, as discussed above in the background. Alternatively, the etch stop layer 105 can consist essentially of any material to which etch selectivity can be achieved when etching the overlying ILD 112. The thickness of the etch stop layer 105 is illustratively between about 2 nm and 30 nm, more preferably between about 5 nm and 15 nm, and most preferably about 7 to 10 nm.

The via contact 100 includes a second layer 104 of material contacting a top surface 101 of the diffusion region 102, the second layer 104 including a layer 106 consisting essentially of a second metal lining the sidewalls of the opening 110, and also including a silicide 108 of the second metal that is disposed in contact with the top surface 101 of the diffusion region 102. Preferably, the layer 106 consists essentially of a silicide-forming metal such as titanium (Ti), cobalt (Co), nickel (Ni), tantalum (Ta), platinum (Pt), tungsten (W) or combination thereof, and layer 108 includes the silicide of that metal. Thus, when the diffusion region 102 is disposed in single-crystal silicon, examples of a material included in the silicide layer 108 include, but are not limited to: $TiSi_x$, $CoSi_x$, $TiCoSi_x$, NiSi, $NiCoSi_x$, $TaSi_2$, $PtSi_2$, and $WSi_x$. When the diffusion region 102 is disposed in silicon germanium (SiGe), the silicide layer 108 can include materials such as one or more of the suicides including, but not limited to: $TiSi_xGe_y$, $CoSi_xGe_y$, $TiCoSi_xGe_y$, $NiSi_xGe_y$, $NiCoSi_xGe_y$, $TaSi_xGe_y$, $PtSi_xGe_y$, and $WSi_xGe_y$.

The layer 106 of metal lining the sidewall 114 of the opening 110 can either have uniform thickness, or instead be subject to variations in thickness from a lower edge 116 to an upper edge 118 of the layer 106. When depositing metal into an opening, variations in the thickness of deposited material are subject to occur based on proximity of the surface to the source of material to be deposited. Hence, parts of the opening 110 in the ILD 112 which are closer to the outer surface 120 thereof are more likely to receive a thicker layer of metal during a deposition of the metal layer into the opening, while parts of the opening 110 that are closer to the surface 101 of the diffusion region 102 of the substrate are more likely to receive a thinner layer of metal during the deposition. The embodiments of the invention described herein are suitable for use regardless of the thickness of the deposited metal in different parts of the opening 110 in which the via contact 100 is disposed.

As further shown in FIG. 1, the via contact further includes a diffusion barrier layer 122 overlying the second layer 104. A further layer 124 overlies the diffusion barrier layer 122, that layer 124 including a third metal which fills the remaining opening 110, preferably to the level of the outer surface 120 of the ILD 112. The diffusion barrier layer 122 preferably includes a conductive nitride material. Metal nitrides such as titanium nitride (TiN), tantalum nitride (TaN), tungsten nitride ($WN_x$) and nitrides of vanadium (V), niobium (Nb), hafnium (Hf) and zirconium (Zr) are suitable for this purpose. Preferably, the metal nitride includes a nitride of the second metal that is included in the second layer 106. Thus, when the second metal is Ti, or Ta, the conductive nitride is a nitride of that second metal, i.e., either TiN, or TaN, respectively. When the diffusion barrier layer 122 includes TiN, it preferably has a thickness of between about 3 nm and 10 nm, and more preferably about 5 nm.

The via contact 100 further includes a filler metal 124 disposed in the opening 110 of the ILD 112. Ideally, the filler metal 124 is formed in such way that no void results in the opening 110. Voids are detrimental to the long-term reliability of the via contact 100, as well as those structures to which the via contact is juxtaposed, i.e., the diffusion region 102. Examples of metals for use as the filler metal 124 include tungsten, and aluminum which can be deposited by efficient techniques that result in good filling qualities, such as by chemical vapor deposition (CVD). Tungsten is the preferred metal for a variety of reasons, as will be described further below.

As further shown in FIG. 1, the top surface 126 of the via contact 100 preferably presents a planar surface, i.e., planarized to the outer surface 120 of the ILD 112, for allowing good contact to be made thereto from higher level metallizations (not shown) that are provided subsequently thereto.

Figure 2:
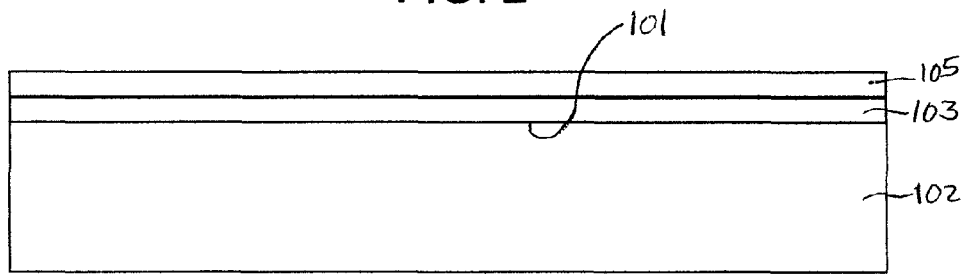
FIGS. 2 through 8 further illustrate stages in a method of fabricating a contact via according to an embodiment of the invention.

FIGS. 2 through 8 illustrate a method of fabricating a contact via according to an embodiment of the invention. FIG. 2 illustrates a preliminary stage in the fabrication. As shown therein, a first layer 103 containing a silicide of a first metal is disposed at a top surface 101 of a diffusion region 102 of a single-crystal semiconductor region of a substrate. Prior to forming the first layer 103, a dopant implant is preferably performed to increase the concentration of dopant ions near the top surface 101, thereby enhancing the conductivity of the diffusion region 102 at the surface 101. The silicide of the first layer 103 is formed preferably by a self-aligned technique in which a silicide precursor metal is deposited in contact with the top surface 101 of the diffusion region 102, that region preferably being formed in a single-crystal silicon region or silicon alloy region (e.g., SiGe region) of a substrate and then reacted by annealing to form the silicide. Examples of suitable silicide precursor metals include, but are not limited to: cobalt, nickel, molybdenum, niobium, palladium, platinum, tantalum, titanium, vanadium and tungsten. Alternatively, the first layer 103 is formed by deposition of a silicide onto the single-crystal semiconductor region 102 in an additive or subtractive patterning process. The first layer is preferably formed having a nominal thickness between about 8 nm and 15 nm, and more preferably having a nominal thickness between about 10 nm and 13 nm. Generally, it is not possible to maintain the thickness of the first layer uniform across an entire wafer. Therefore, when the first layer is deposited to a thickness of 10 nm in some places of the wafer, the thickness can be significantly lower in other places of the wafer. Thus, a thickness of 8 nm or lower may result in some areas of the wafer.

Figure 3:
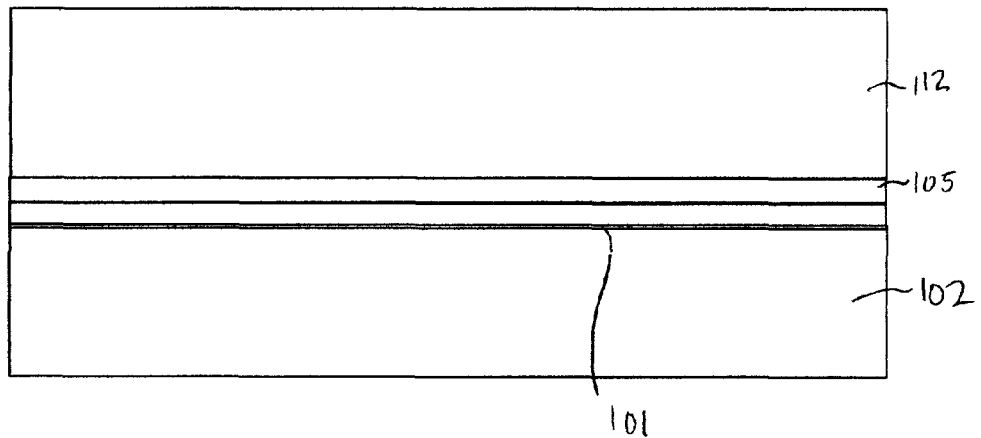

Thereafter, as shown in FIG. 3, the interlevel dielectric (ILD) 112 is formed over the etch stop layer 105. The ILD is preferably formed by a low temperature deposition of a highly flowable, planarizing oxide such as borophosphosilicate glass (BPSG), or, alternatively, from a tetraethylorthosilicate (TEOS) precursor. In other alternatives, a spin-on-glass (SOG) material having planarizing qualities is flowed onto a wafer containing the structure shown in FIG. 3, and thereafter, the wafer is rotated to distribute the SOG material to a more or less uniform height above the top surface 101 of the diffusion region 102, followed by baking to densify the distributed SOG layer. In still another alternative, a denser oxide such as one deposited by a high-density plasma (HDP) technique is deposited onto the structure and, thereafter, planarized by additional processing such as chemical mechanical polishing (CMP).

Figure 4:
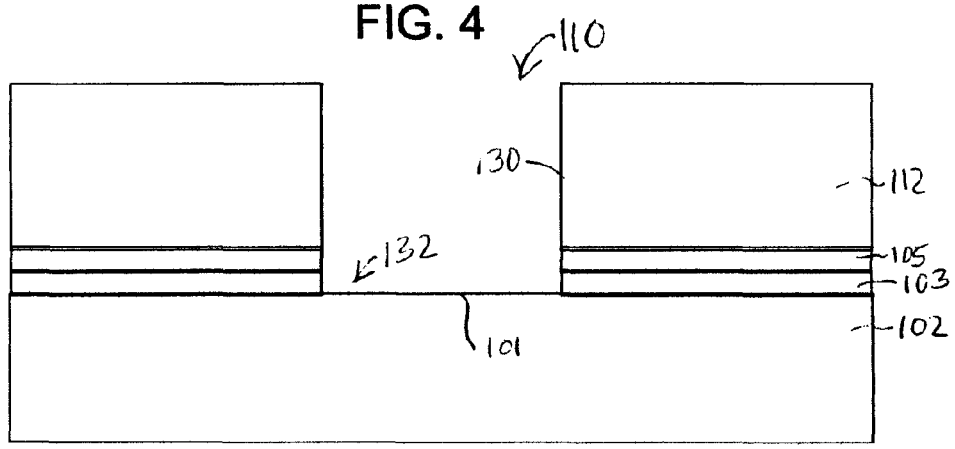

FIG. 4 illustrates a subsequent stage in which an opening is formed in each of the ILD 112, the etch stop layer 105, and the first layer 103. Preferably, the opening in the ILD 112 is formed by an anisotropic etch such as a reactive ion etch (RIE), performed selectively to the material of the etch stop layer 105. For example, when the etch stop layer contains a nitride, the RIE process is conducted selective to that nitride. This causes etching to stop on the etch stop layer 105. With sufficient selectivity, an over-etch can be performed to ensure that all such openings on a wafer are fully etched to expose the etch stop layer 105, thus assuring that the etched openings reach the intended level of the structure underlying the ILD 112. Thereafter, the etch stop layer 103 is preferably cleared from the opening, as by isotropically etching selective to the underlying silicide material of the first layer 103, and the material of the ILD 112. In a further etch step, a sputter "clean" process is performed in the opening 110 using a beam of particles to remove residues from prior etching that remain on the sidewall 130 and bottom 132 of the opening 110. In a preferred process, this sputter etch step removes the uppermost 8 nm of material from the bottom 132 of the opening 110. Thus, this step removes a significant portion of the first layer 103 of silicide that is provided on the diffusion region. In fact, sputter clean processes generally have some non-uniformity across a wafer, such that a greater thickness of material is removed in some areas than others. Moreover, as discussed above, the thickness of the first layer 103 of silicide is subject to vary across the wafer. Accordingly, at least in some areas of the wafer, the sputter clean process results in the entire removal of the first layer 103 within the opening 110, thus exposing the top surface 101 of the diffusion region 102 in the opening.

Figure 5:
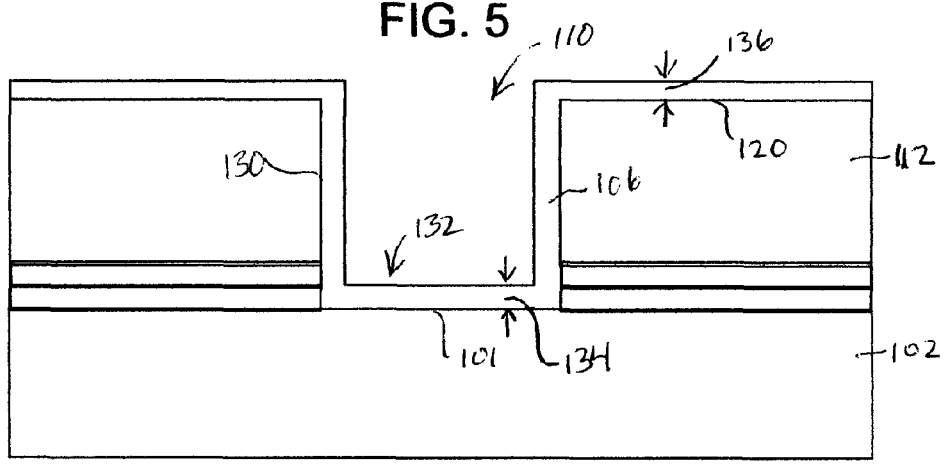

Thereafter, as shown in FIG. 5, a second layer 106 including a second metal is deposited to line the bottom 132 and sidewalls 130 of the opening 110. The deposited second metal is capable of forming a silicide with the exposed silicon at the top surface 101 of the diffusion region 102. The deposited second metal also promotes adhesion between the sidewall 130 of the dielectric region 112 and one or more materials that are deposited subsequently within the opening. The second metal preferably consists essentially of one or more of the metals: titanium (Ti), cobalt (Co), nickel (Ni), tantalum (Ta), platinum (Pt) or tungsten (W) and is preferably deposited into the opening by sputtering. More preferably, the second metal consists essentially of Ti. When the second metal consists essentially of Ti, it is preferably deposited to a nominal thickness of at least 30 angstroms (Å) at a point of contact with the top surface 101 of the diffusion region 102. Variations in the character of the sputtering process across the wafer may cause the actual thickness 134 of the deposited second metal at the top surface 101 to be somewhat greater or less than the nominal thickness. More preferably, the Ti is deposited to a nominal thickness of between 40 Å and 80 Å in contact with the top surface 101 of the diffusion region. Moreover, the deposited thickness of the layer is typically greater in areas of the wafer which are closer to the source of the sputtered species. Therefore, a deposited thickness 134 of 40 to 50 Å at the top surface 101 of the diffusion region corresponds to a nominal deposited thickness 136 of 30 nm overlying the outer surface 120 of the ILD 112. A somewhat greater deposited thickness 134 of 60 to 80 Å at the top surface 101 corresponds to a nominal deposited thickness 136 of 40 nm overlying the outer surface 120 of the ILD 112. Here, the thickness of the second layer at the top surface 101 is being controlled according to the embodiments of the invention.

Figure 6:
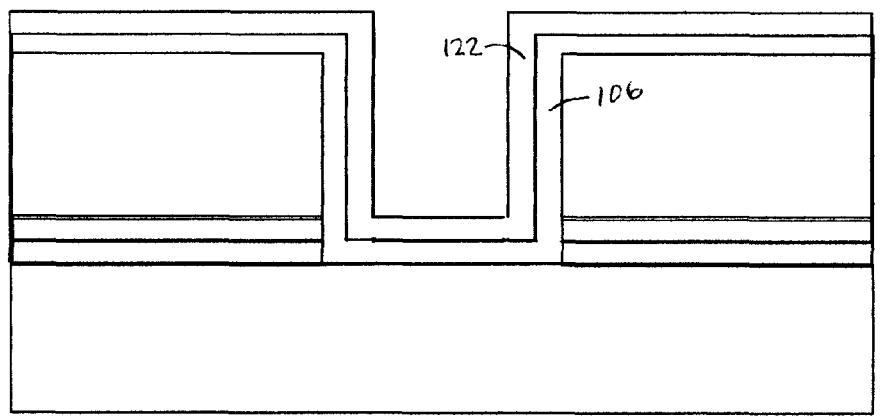
Figure 7:
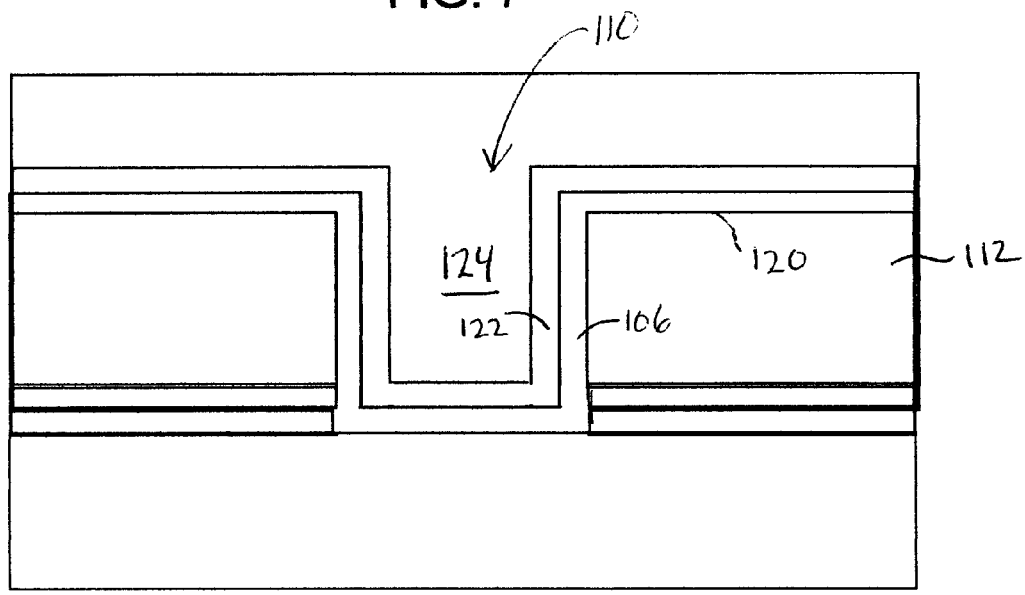

Thereafter, as shown in FIG. 6, a diffusion barrier layer 122 is formed overlying the second metal layer 106. The diffusion barrier layer 122 preferably includes a conductive nitride material. Preferably, when the second metal is Ti, the conductive nitride consists essentially of TiN, as being a nitride of the second metal that is included in the second layer 106. Other metal nitrides such as tantalum nitride (TaN), tungsten nitride ($WN_x$) and nitrides of V, Nb, Hf and Zr are also suitable. Preferably, the conductive nitride material, such as TiN, is deposited by CVD, because CVD produces a TiN layer having more uniform coverage than a TiN layer deposited by sputtering. In addition, a TiN layer can be deposited in a shorter amount of time by CVD than such layer can be deposited by sputtering. As shown in FIG. 7, a further layer 124 is then deposited to overlie the diffusion barrier layer 122, that layer 124 including a third metal which fills the remaining opening 110. The third metal 124 is deposited to fill the opening 110 and extend onto the region above the outer surface 120 of the ILD 112. Preferably, the third metal is deposited by any of several well-known chemical vapor deposition (CVD) processes such as ordinary CVD, plasma enhanced CVD (PECVD), metalorganic (MOCVD), or low-pressure CVD (LPCVD). Ideally, the filler metal 124 is deposited in such way to prevent voids from forming within the opening 110. Examples of metals for use as the filler metal 124 include tungsten (W) and aluminum (Al) both of which can be deposited by one or more of the above-indicated techniques to produce good fill characteristics. Tungsten is a preferred metal because it can be deposited by well-understood CVD techniques over an underlying diffusion barrier layer of TiN.

Figure 8:
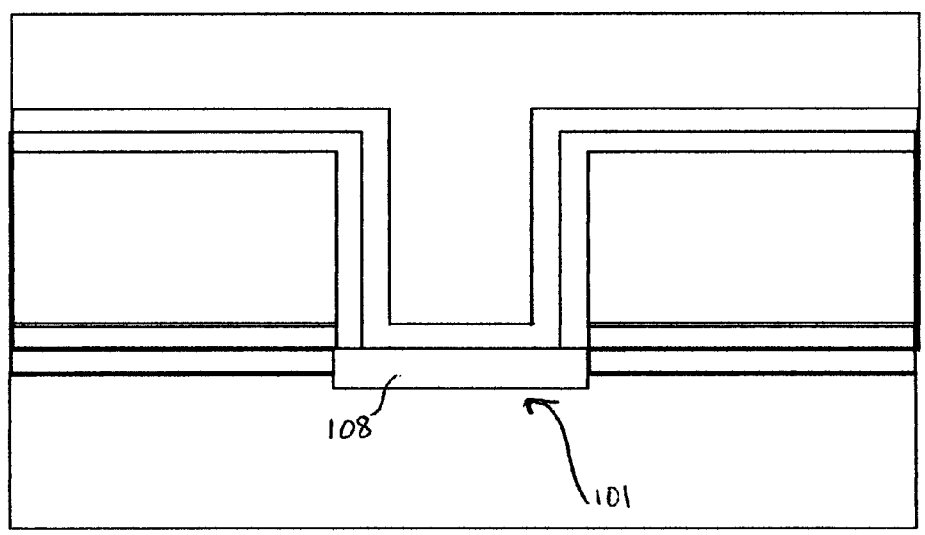

Thereafter, after the above-described processes have been performed, annealing is performed to react the second metal at the top surface 101 with the silicon present at the top surface 101 to produce a silicide 108, as shown in FIG. 8. This silicide forms an ohmic contact to the diffusion region. Depending upon the specific metal or metals that are deposited as the second layer 106, the silicide layer 108 includes, but is not limited to any one or more of the suicides of cobalt (Co), nickel (Ni), platinum (Pt), tantalum (Ta), titanium (Ti), and tungsten (W). Preferably, the silicide layer includes one or more of $TiSi_x$, $CoSi_x$, $TiCoSi_x$, NiSi, $NiCoSi_x$, $TaSi_2$, $PtSi_2$, and $WSi_x$. When the diffusion region 102 is disposed in silicon germanium (SiGe), the silicide layer 108 can include, but is not limited to any one or more of the suicides and germanides of cobalt (Co), nickel (Ni), platinum (Pt), tantalum (Ta), titanium (Ti), and tungsten (W), and especially: $TiSi_xGe_y$, $CoSi_xGe_y$, $TiCoSi_xGe_y$, $NiSi_xGe_y$, $NiCoSi_xGe_y$, $TaSi_xGe_y$, $PtSi_xGe_y$, and $WSi_xGe_y$.

Referring to FIG. 1 again, thereafter, the top surface 126 of the conductive filler material 124 is planarized to the outer surface 120 of the dielectric region, such as by a chemical mechanical polishing (CMP) or other suitable known planarization technique. Thereafter, additional contact structures and processing, can be used to further interconnect the contact via 100 to higher level interconnect structures on an integrated circuit or other device in which the contact via is disposed.

As indicated above, the embodiments of the invention described herein provide a contact via having acceptable contact resistance, despite that the initial silicide layer 103 is removed during the initial formation of the opening. Measurements performed on contact vias processed according to the above-described embodiments indicate acceptable contact resistance when the second layer is deposited to a nominal thickness 136 (FIG. 5), as measured above the outer surface 120 of the dielectric region, of 30 nm or more, while a deposited thickness of 20 nm and less shows poor contact resistance. The measurements are indicated below.

| Thickness 136 (FIG. 5) | Average Resistance per Contact |
| --- | --- |
| 20 nm | 23 ohm |
| 30 nm | 13 ohm |
| 40 nm | 13 ohm |

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A via contact structure having a via contact to a diffusion region at a top surface of a substrate, the via contact structure comprising:
    a first layer consisting essentially of a silicide of a first metal in contact with said diffusion region at said top surface;
    a dielectric region overlying said first layer, said dielectric region having an outer surface and an opening extending from said outer surface through said first layer to said top surface of said substrate;
    a second layer lining said opening and contacting said top surface in said opening, said second layer including a second metal lining a sidewall of said opening and a silicide of said second metal self-aligned to said top surface in said opening;
    a diffusion barrier layer overlying said second layer within said opening; and
    a third layer including a third metal overlying said diffusion barrier layer and filling said opening.

2. The via contact structure as claimed in claim 1, wherein said first metal is selected from the group consisting of cobalt (Co), molybdenum (Mo), niobium (Nb), nickel (Ni), palladium (Pd), platinum (Pt), tantalum (Ta), titanium (Ti), vanadium (V) and tungsten (W).

3. The via contact structure as claimed in claim 2, wherein said second metal is selected from the group consisting of titanium (Ti), nickel (Ni), platinum (Pt), cobalt (Co), tantalum (Ta), and tungsten (W).

4. The via contact structure as claimed in claim 3, wherein said first metal and said second metal are the same.

5. The via contact structure as claimed in claim 3, wherein said first metal consists essentially of cobalt and said second metal consists essentially of titanium.

6. The via contact structure as claimed in claim 1 wherein said diffusion barrier layer includes a metal nitride.

7. The via contact structure as claimed in claim 6, wherein said metal nitride includes titanium nitride (TiN).

8. The via contact structure as claimed in claim 1, wherein said third metal includes tungsten (W).

9. The via contact structure as claimed in claim 1, wherein said opening has a width of about 250 nm or less and a height-to-width aspect ratio greater than one.

10. The via contact structure as claimed in claim 9, wherein said aspect ratio value is about two.

* * * * *